(12) United States Patent
Oberlin et al.

(10) Patent No.: US 7,113,418 B2
(45) Date of Patent: Sep. 26, 2006

(54) MEMORY SYSTEMS AND METHODS

(75) Inventors: William L. Oberlin, Sunnyvale, CA (US); Mark R. Simpson, Cupertino, CA (US); Srinivas Venkataraman, Santa Clara, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 447 days.

(21) Appl. No.: 10/700,389

(22) Filed: Nov. 4, 2003

(65) Prior Publication Data

US 2005/0097249 A1 May 5, 2005

(51) Int. Cl.
*G11C 6/06* (2006.01)
*G11C 7/00* (2006.01)

(52) U.S. Cl. .......................... 365/63; 365/51
(58) Field of Classification Search ............... 365/51, 365/63, 52; 257/777
See application file for complete search history.

(56) References Cited

U.S. PATENT DOCUMENTS

| | | | |
|---|---|---|---|
| 5,996,880 A * | 12/1999 | Chu et al. ............ | 228/180.21 |
| 6,192,431 B1 | 2/2001 | Dabral et al. | |
| 6,366,972 B1 | 4/2002 | Grebenkemper et al. | |
| 6,542,393 B1 * | 4/2003 | Chu et al. ............ | 365/51 |
| 2005/0142696 A1 * | 6/2005 | Tsai ............ | 438/114 |

* cited by examiner

*Primary Examiner*—Son T. Dinh

(57) ABSTRACT

Memory systems and methods are described. In one embodiment, a circuit board has front and back surfaces. At least one memory device having a plurality of pins is mounted on the front surface of the circuit board. At least one other memory device having a plurality of pins is mounted on the back surface of the circuit board. The memory devices are mounted on the circuit board such that at least some pins from the one memory device align with at least some pins of the other memory device to provide aligned pin pairs. A via is disposed in the circuit board and extends between and connects individual pins of an aligned pin pair.

29 Claims, 14 Drawing Sheets

MEMORY SYSTEMS AND METHODS

BACKGROUND

The trend in the computer industry is toward designing systems with higher processing speeds and smaller packaged subsystems to increase performance and throughput in support of increasingly demanding applications. Information access from off-chip caches and memories to the processing unit dictates overall performance of these computing systems. A processing unit made up of an integrated circuit typically connects to an external cache or memory IO through wiring (i.e. a bus) on a printed circuit board. External bus speeds do not scale with improvements in speed within the integrated circuit or processing unit due to the limiting effects of board level parasitics, which include connecting wires and discontinuities in the signal path such as those associated with vias and stubs.

Component package parasitics on power and ground paths limit power delivery to on-die circuitry to support high speed switching transients. Bus performance is generally improved in terms of timing and noise margin by optimizing the interconnect topology between the connecting devices, by reducing wiring lengths, matching wire lengths, minimizing discontinuities, providing proper termination and adequate decoupling.

Circuit boards such as motherboards designed for high performance systems need to support a variety of fine pitch components with high IO density using a combination of signal redistribution, signal routing, and power and ground layer configurations thus driving overall layer count and board thickness higher. Connectivity or transition between various metal layers is accomplished using vias with conductive walls through openings in dielectric layers. These vias present themselves as electrical discontinuities to the controlled impedance interconnect path from the controller to the memory devices. Compared to standard memory dual in line memory modules (DIMM) modules which host only memory devices, layer to layer via transitions for signal routing in motherboards has become more electrically significant because of relatively large board thickness.

Accordingly, this invention arose out of concerns associated with providing improved memory systems and related methods.

DETAILED DESCRIPTION

Overview

Various embodiments described below provide memory systems in which individual memory devices, such as synchronous DRAMs (SDRAMs) and Double Data Rate (DDR) SDRAMs, are mounted on a circuit board in a staggered configuration that is designed to reduce the number of discontinuities and interconnect routing lengths. Where termination is utilized, the embodiments facilitate net length matching and reduce stub loading, thus enhancing the system's signal integrity and contributing to higher frequency operation. In addition, the circuit board real estate that is utilized to implement the described memory systems can be reduced, thus enabling higher component counts and greater functionality of the circuit board and in turn, the computing system in which the memory system is employed. Additionally, the various embodiments can allow for probe points at vias and surface pads, all of which can be accessible from one side of the circuit board. This facilitates in-circuit testing and engineering signal integrity measurements. Various embodiments also support location of decoupling capacitors in close proximity to power pins to improve overall power delivery.

Exemplary Single Bank and Dual Bank DRAM Systems

The various embodiments described below can be employed in the context of both single bank and dual bank DRAM systems. Consider FIGS. 1 and 2 which show, respectively, exemplary single and dual bank memory systems whose topology can be provided by various embodiments described below.

Figure 1:
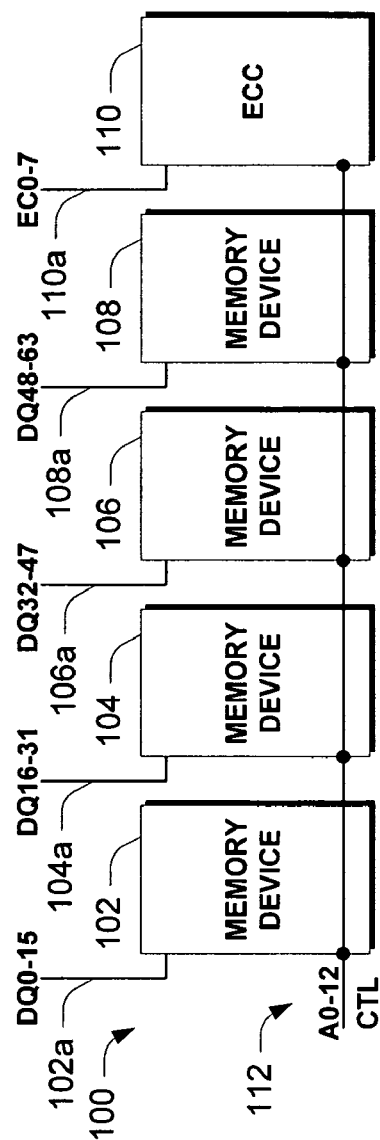
FIG. 1 shows a single bank synchronous DRAM design.

FIG. 1 shows a single bank memory system generally at 100 comprising four memory devices (e.g. SDRAMs) 102, 104, 106 and 108, and an error code checking (ECC) device 110. The ECC device is typically the same device as the regular SDRAM devices, i.e. devices 102–108. ECC data bits are wired logically to specific pins on the memory controller to accomplish the error code checking function, as will be appreciated by the skilled artisan. Error code checking allows data that is being read or transmitted to be checked for errors and corrected as necessary.

System 100 is typically mounted on a circuit board (not specifically shown). Individual devices 102–110 are typically connected to a memory controller, which is not specifically illustrated in this example. Each device has associated data lines, address lines, and control lines. Data lines are shown diagrammatically at 102a, 104a, 106a, 108a and 10a. Address and control lines are shown diagrammatically at 112.

In this arrangement, each data signal line connects to one device. The data signals are electrically lightly loaded, as each is wired from the memory controller to only one device. Address and control semaphores wire to all of the devices. The address and control lines are in effect electrically heavily loaded with interconnect parasitics at the board and package level due to connectivity with all devices within the memory system. Heavy electrical loading is a performance limiter on the frequency of operation of this bus interface.

Figure 2:
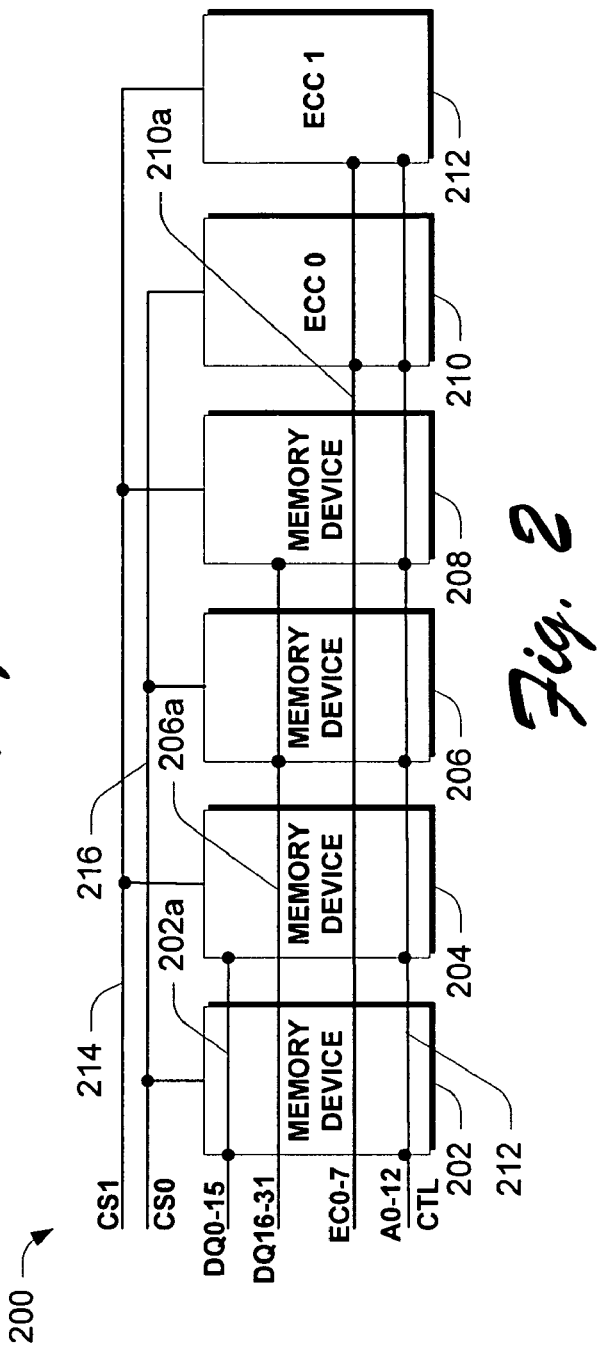
FIG. 2 shows a dual bank synchronous DRAM design.

FIG. 2 shows a dual bank memory system generally at 200 comprising four memory devices 202–208 and two error code checking devices 210, 212. Here, two memory devices share the data bus for each data bit. For example, data line 202a is connected with memory devices 202 and 204. Similarly, data line 206a is connected with memory devices 206 and 208. Memory devices 202 and 206 collectively constitute a first bank. Memory devices 204 and 208 collectively constitute a second bank. Likewise error code line 210a is connected with error code checking devices 210 and 212 for banks 0 and 1 respectively. Address and control lines 212 connect with each of the devices and chip select lines 216, 214 enable the memory controller to select one of the two data banks for a read or write operation. This particular arrangement, as will be appreciated by the skilled artisan, results in an additional electrical load on each data bit and a requirement to match trace lengths to minimize reflections due to stub loading.

Exemplary Single Bank Embodiment

Figure 3:
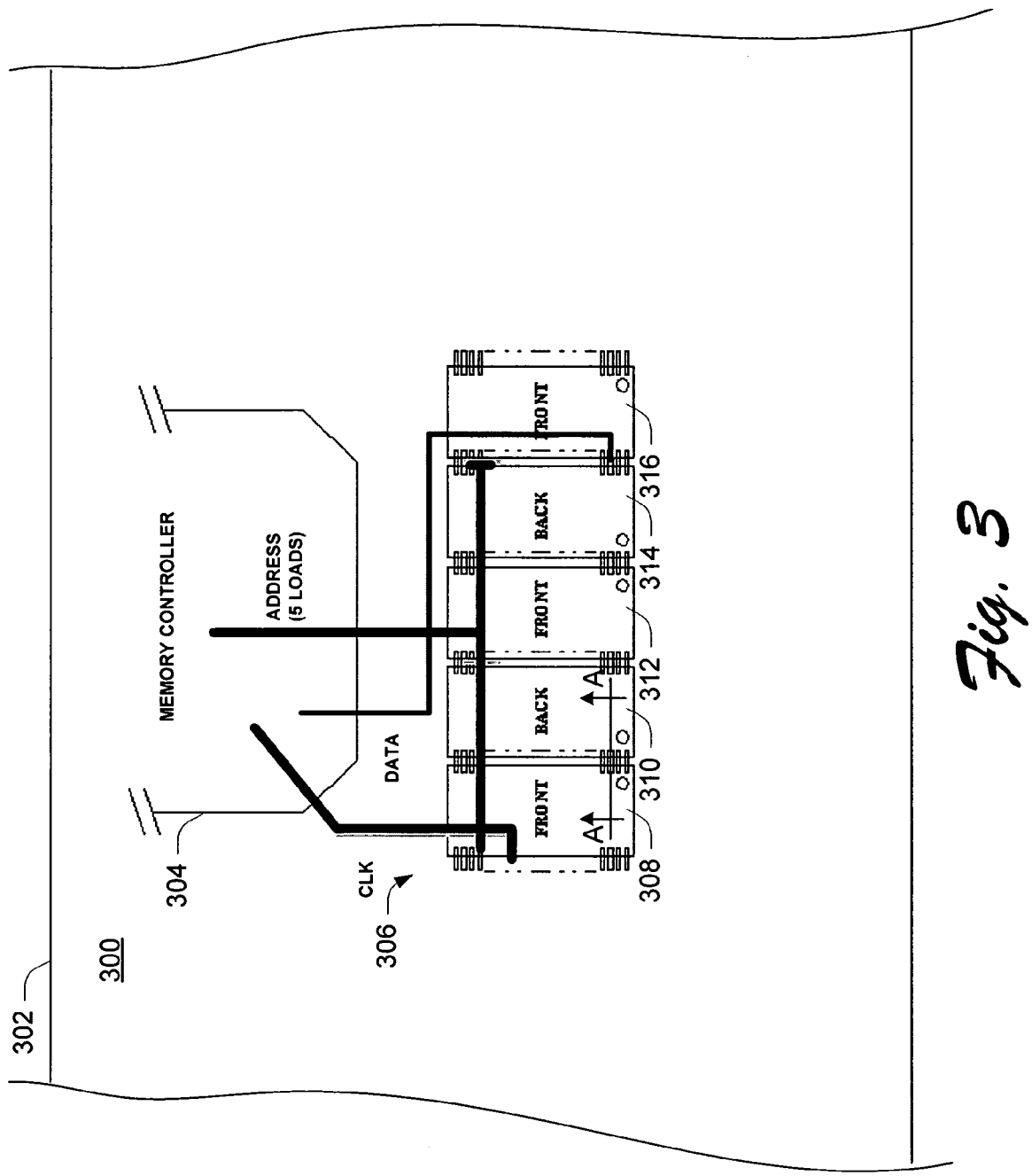
FIG. 3 shows an exemplary memory system that utilizes a staggered memory device configuration in a single bank synchronous DRAM design in accordance with one embodiment.

FIG. 3 shows an exemplary memory system in accordance with one embodiment generally at 300. Memory system 300 comprises a circuit board 302 in the form of a printed wiring circuit board (PWB) having mounted thereon a memory controller 304 and a memory device bank 306 comprising individual memory devices 308, 310, 312, 314 and 316. A printed wiring board provides both the physical structure for mounting and holding electronic components as well as the electrical interconnection between components. A PWB typically consists of a non-conducting substrate (typically fiberglass with epoxy resin) upon which a conductive pattern or circuitry is formed. A multilayer PWB consist of alternating layers of conductor and insulating material bonded together. The conductive layers are connected by plated through-holes called vias, which are also used to electrically connect to components.

In the illustrated example, memory devices 308, 312 and 316 are mounted on the front surface or front of circuit board 302 and memory devices 310 and 314 are mounted on the back surface or back of circuit board 302. An address line connects to all five memory devices and each data line connects to one memory device from the memory controller. Collectively, the memory devices 308–316 are mounted in a staggered configuration such that at least some individual pins of each memory device align with and share a via with at least some individual pins of a memory device mounted on an opposite side of the circuit board. Such aligned, via-sharing pins constitute individual pin pairs. That is, the devices are staggered such that a row of package pins from one device on the top or front of the circuit board aligns with a row of package pins on the next device located on the bottom or back of the circuit board. This allows for address or control pins from two devices to connect directly, with a very short interconnect. In the illustrated example, only one via is used at the point of connection to the two pins of the two integrated circuit components placed on the front and back of the circuit board. That is, individual pins of the front and back mounted memory devices share vias that are connected with conductive traces within the circuit board. Understandably, by sharing vias, the total number of vias that are utilized on the circuit board can be reduced. This, in turn, reduces the total number of perforations that are made in the circuit board.

Figure 4:
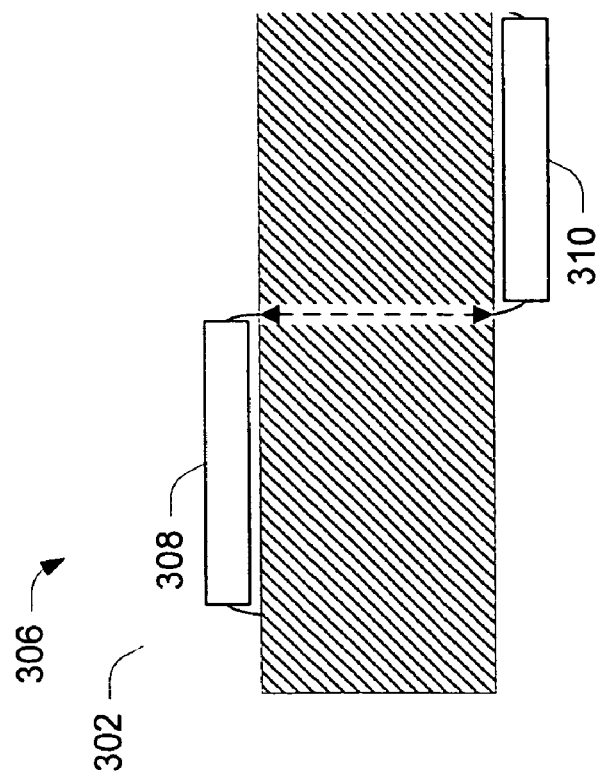
FIG. 4 is a view of the FIG. 3 memory system taken along line A—A in FIG. 3.

FIG. 4 shows a view that is taken along line A—A in FIG. 3. There, the pin alignment of individual memory devices is diagrammatically shown in more detail. It is to be understood that the this figure is diagrammatic in nature and is not intended to illustrate the actual way that the pins are mounted on the circuit board.

Figure 5:
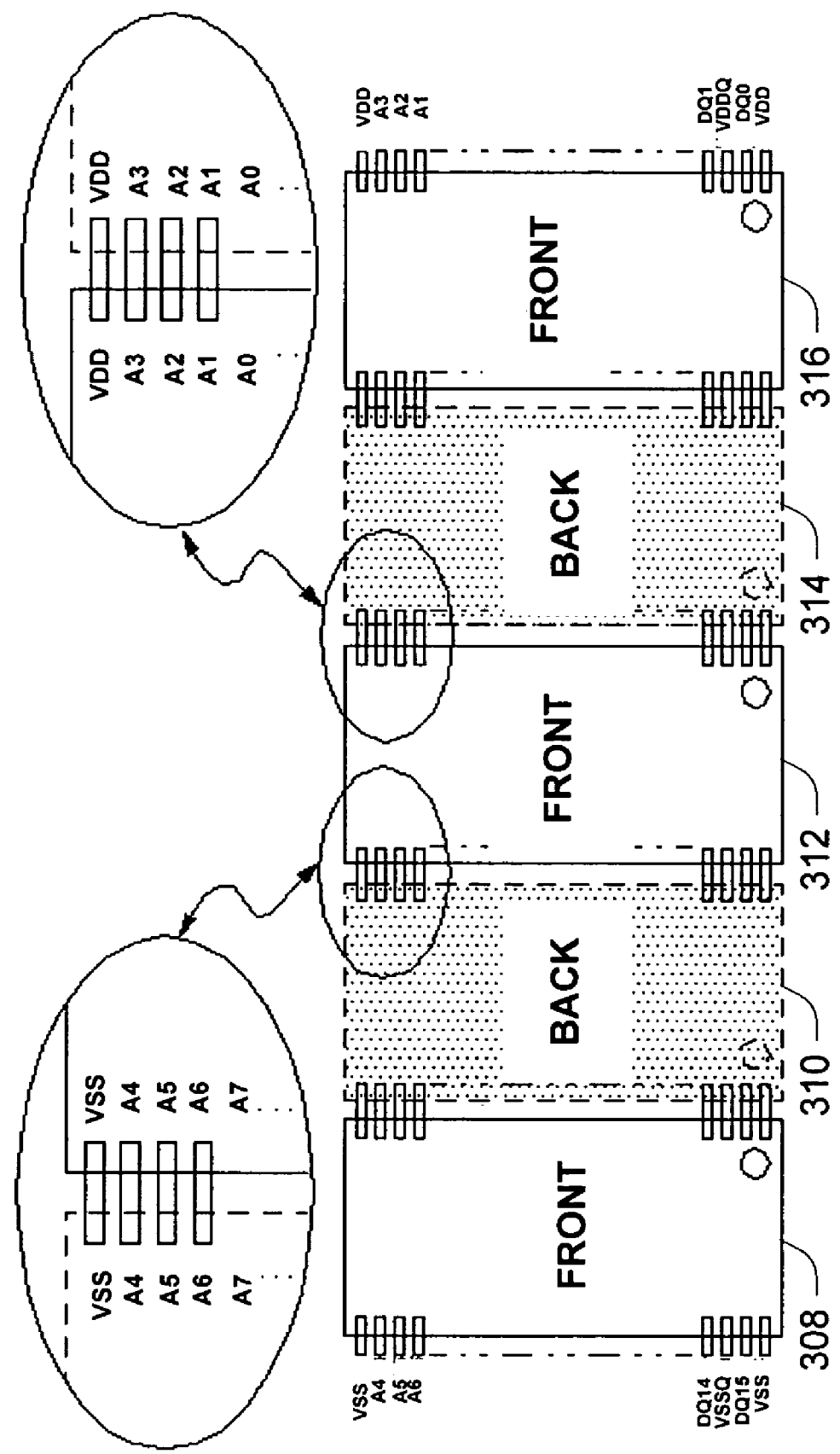
FIG. 5 is a view of the FIG. 3 memory system that shows address pin alignment in greater detail.

FIG. 5 shows the arrangement of FIG. 3 in additional detail. Notice that the same pins or bits on different memory devices line up. Specifically, notice that the illustrated address pins for memory device 310 on the back side of the circuit board (i.e. A4, A5, A6 and so on) line up and correspond to the same address pins for memory device 312 on the front side of the circuit board (i.e. A4, A5, A6 and so on). Likewise, the address pins for memory device 312 (i.e. A3, A2, A1 and so on) line up and correspond to the same address pins for memory device 314 (i.e. A3, A2, A1 and so on). In this example, one particularly advantageous feature is that the individual memory devices can comprise typical "off the shelf" memory devices. That is, in at least some embodiments, the memory devices need not be specially configured to have a special arrangement of pins. Thus, these embodiments can take advantage of the way that particular manufacturers have decided to lay out the pins for a particular memory device. In the illustrated example, the memory devices comprise dual row, gull wing type devices.

Figure 6:
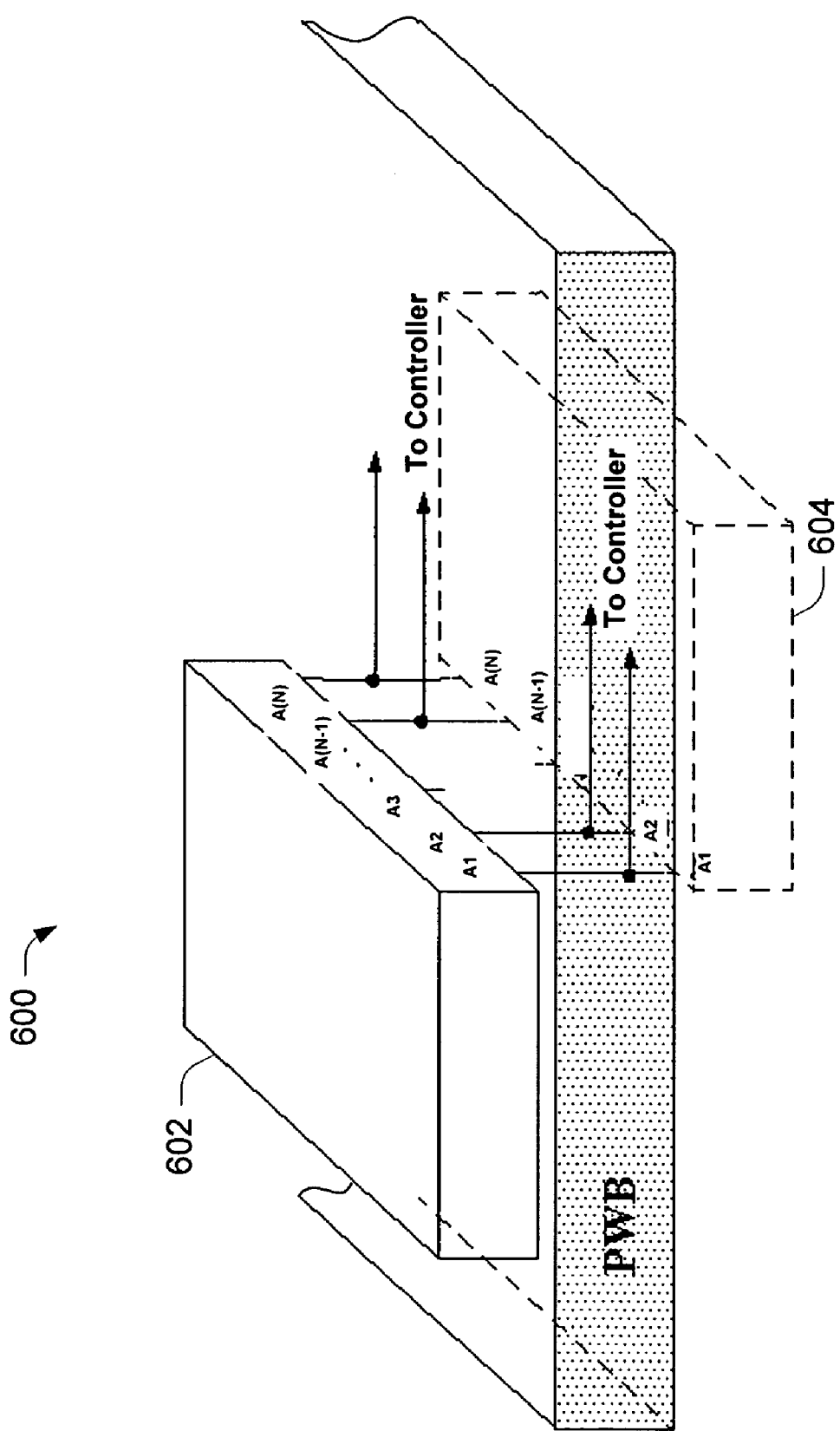
FIG. 6 illustrates connectivity from two of the FIG. 3 memory devices to an associated memory controller.

FIG. 6 shows a diagrammatic view of the arrangement between two individual memory devices generally at 600. Notice that the individual address pins on the top memory device 602 align with individual address pins on the bottom memory device 604. Each of the individual address lines (and control lines) on the illustrated row of device 602 aligns with the corresponding address lines (and control lines) of device 604. The FIG. 6 layout results in what is known as a branched-t electrical load model, as will be appreciated by the skilled artisan. The branched-t topology is discussed in more detail in FIG. 7 just below.

Figure 7:
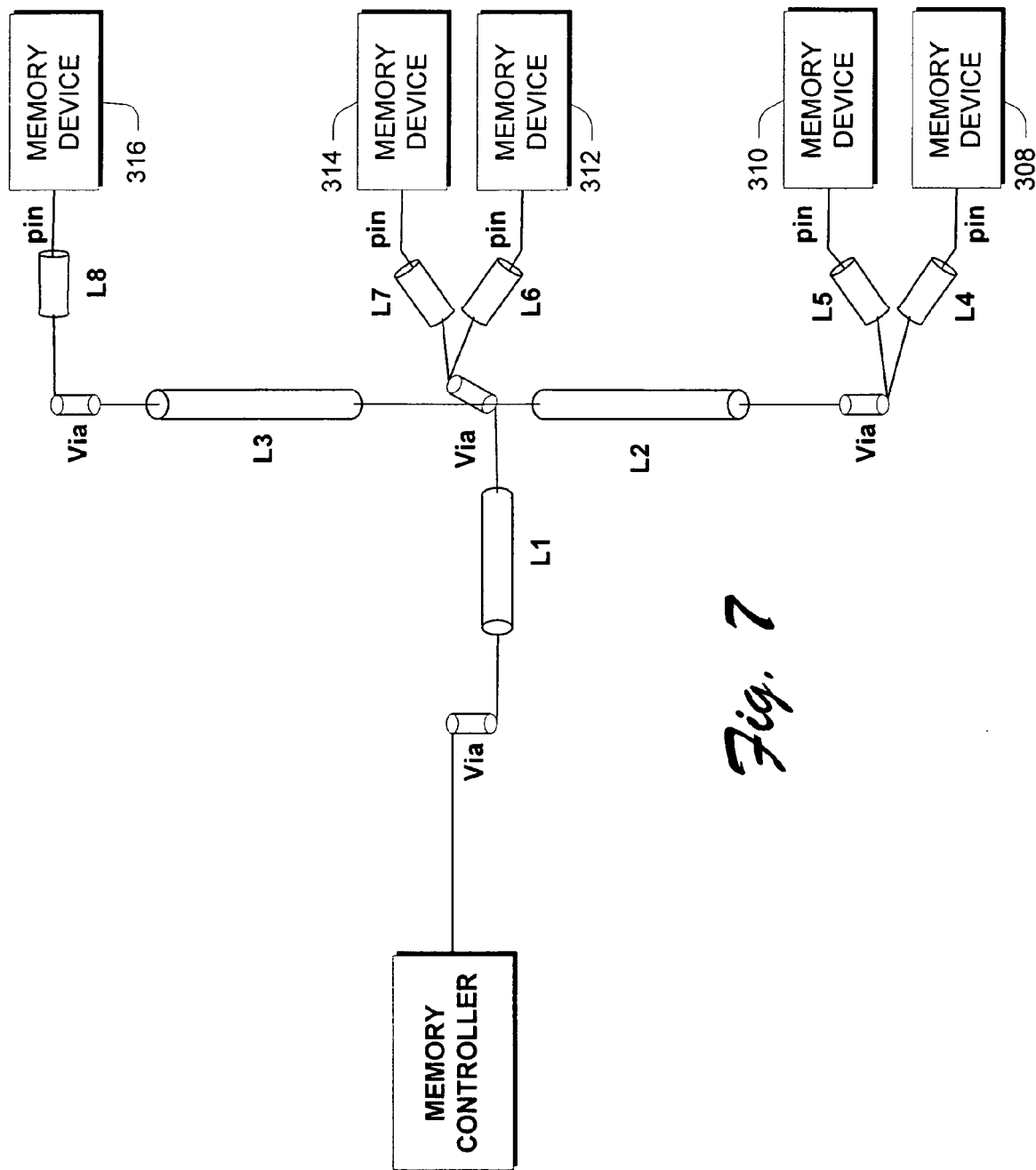
FIG. 7 shows an equivalent electrical loading model on the address and control semaphores for the memory system of FIG. 3.

FIG. 7 shows an equivalent electrical loading model on the address and control semaphores for the single bank memory interface for a single address bit. Segments L4, L5, L6, L7 and L8 are the top or bottom surface layer pin escape lengths that connect from the memory devices to the vias. Pin escapes, as will be appreciated by the skilled artisan, are short surface traces on the circuit board that electrically connect the memory device mounting PAD (component pin interface for soldering) to the via. The length of this metal interconnect is nominally 60 to 100 mils for this embodiment. These pin escape lengths are short such that L4 is much less than LVIA, where LVIA is the length of a through hole via (LVIA is also equal to the thickness of the circuit board). Notice that only one via supports the connectivity from the memory controller to pin escapes L6 and L7, which connect to memory devices 312 and 314. Interconnect segments L2 and L3 are two memory device component widths long. Note that only four vias are utilized to support the entire interconnect topology from the processing agent to all of the memory devices. The same vias can also be used to provide probe access at each device for high-speed signal integrity measurements and in-circuit testing.

Series Termination of Data Signals

For the single bank design discussed above, the data and ECC lines or bits wire directly from each memory device to the memory controller. These signals may utilize series termination to control signal overshoot on data bits depending on memory device or memory controller output impedance, as will be appreciated by the skilled artisan.

Figure 8:
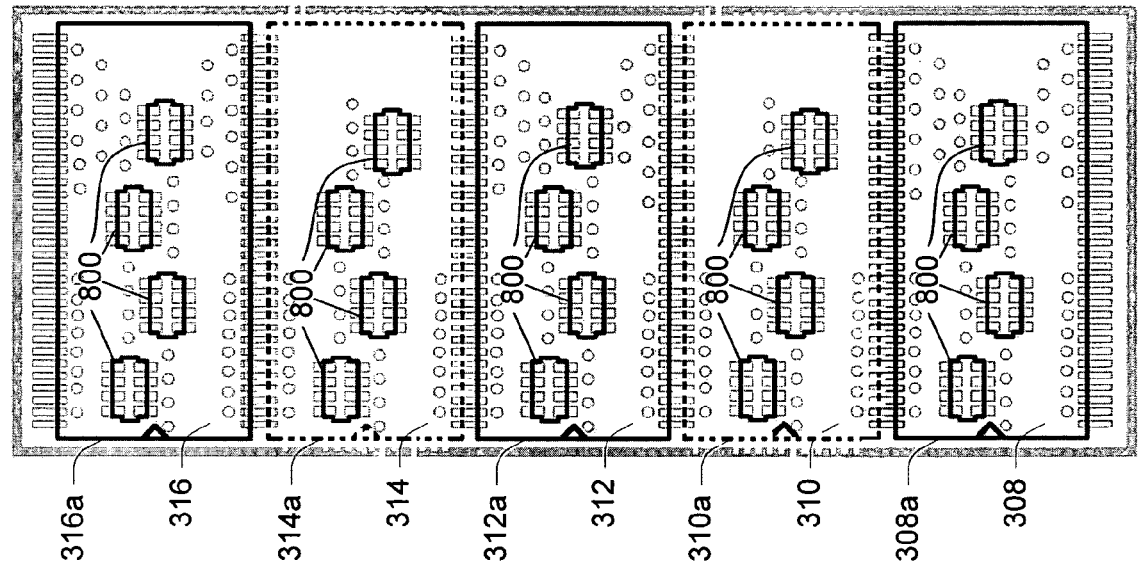
FIG. 8 illustrates the memory system of FIG. 3 along with resistor packs for series termination of data signals in accordance with one embodiment.

The illustrated and described layout supports location of termination resistors or resistor packs under the image or within the footprint of each memory device. As an example, consider FIG. 8 which shows memory devices 308–316 as the devices are laid out on the circuit board. Each memory device has a circuit board footprint. For example, memory device 308 has a corresponding circuit board footprint 308*a*, memory device 310 has a corresponding circuit board footprint 310*a*, and so on. Individual termination resistor packs for series termination of the data signals for each memory device are shown at 800. Notice that the individual termination resistor packs are disposed on the opposite side of the circuit board, within or inside the footprint of each device. Locating the termination resistor packs within the footprint of each of the memory devices allows for very short routing which is highly desirable for effective termination.

The staggered mounting configuration described above can effectively reduce the circuit board area that is utilized to support the memory devices. Specifically, a reduction of the circuit board area of around 9% has been observed when compared to conventional back-to-back DIMM modules.

Additionally, the number of vias, such as those that are utilized to escape data bits from the surface mount devices to the resistor packs can be reduced as compared to conventional DIMM modules. Specifically, some conventional DIMM modules need six vias to support address or control signal connectivity from the memory controller for the same branched-t topology. Some conventional back-to-back DIMM modules require vias for every pin on each device and on all the resistor packs, thus increasing overall via count which leads to more perforations in voltage reference planes in the multi-layer printed circuit board stack-up. A comparison of via counts for the single bank configuration of a conventional back-to-back DIMM module and the above-described staggered configuration, with and without termination resistors is shown in Tables 1 and 2 just below.

TABLE 1

Via Count for Unterminated Single Bank Device

| Signal Type | Back to Back | Staggered |
| --- | --- | --- |
| Address/Control | 6 | 4 |
| Data | 2 | 2 |

TABLE 2

Via Count for Terminated Single Bank Device

| Signal Type | Back to Back | Staggered |
| --- | --- | --- |
| Address/Control | NA | NA |
| Data | 4 | 4 |

Decoupling Capacitors for Enhanced Power Delivery

The illustrated and described layout also supports location of decoupling capacitors under the image or within the footprint of each memory device for enhanced power delivery. Decoupling capacitors, as will be appreciated by the skilled artisan, provide charge to handle local high frequency switching current demands thus reducing noise perturbations in the power delivery system. These capacitors are connected between the power and ground layers using vias which presents a loop inductance in the path. Inductive parasitics reduce capacitor effectiveness at high frequency. The closer the capacitor is to the VCC/VSS pins, the more effective these connections are in terms of reducing inductive parasitics. In some cases an additional surface trace connection can be made directly to the device VCC/VSS pins to shunt the via-plane-via loop inductance.

Figure 9:
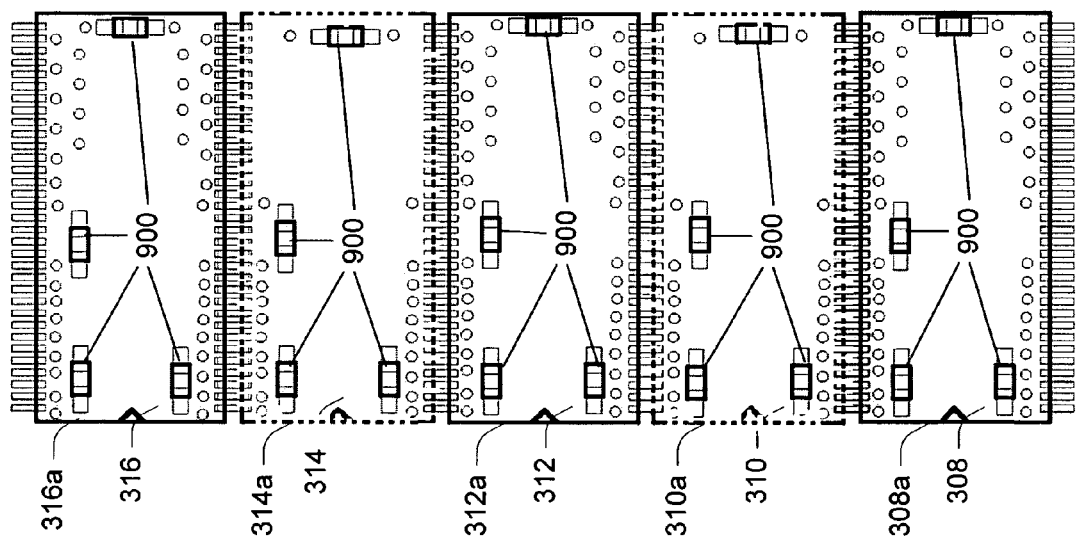
FIG. 9 illustrates the memory system of FIG. 3 along with decoupling capacitors in accordance with one embodiment.

As an example, consider FIG. 9 which shows memory devices 308–316 as the devices are laid out on the circuit board and each device's associated footprint 308*a*–316*a* respectively. Notice that individual decoupling capacitors 900 are disposed on the opposite side of the circuit board, within or inside the footprint of each device. The decoupling capacitors can be located very close to the power and ground pins. Locating the decoupling capacitors within the footprint of each of the memory devices allows for very short routing which is highly desirable for effective low noise power delivery, as noted above.

Alternate Configurations for Single Bank Embodiment

Figure 10:
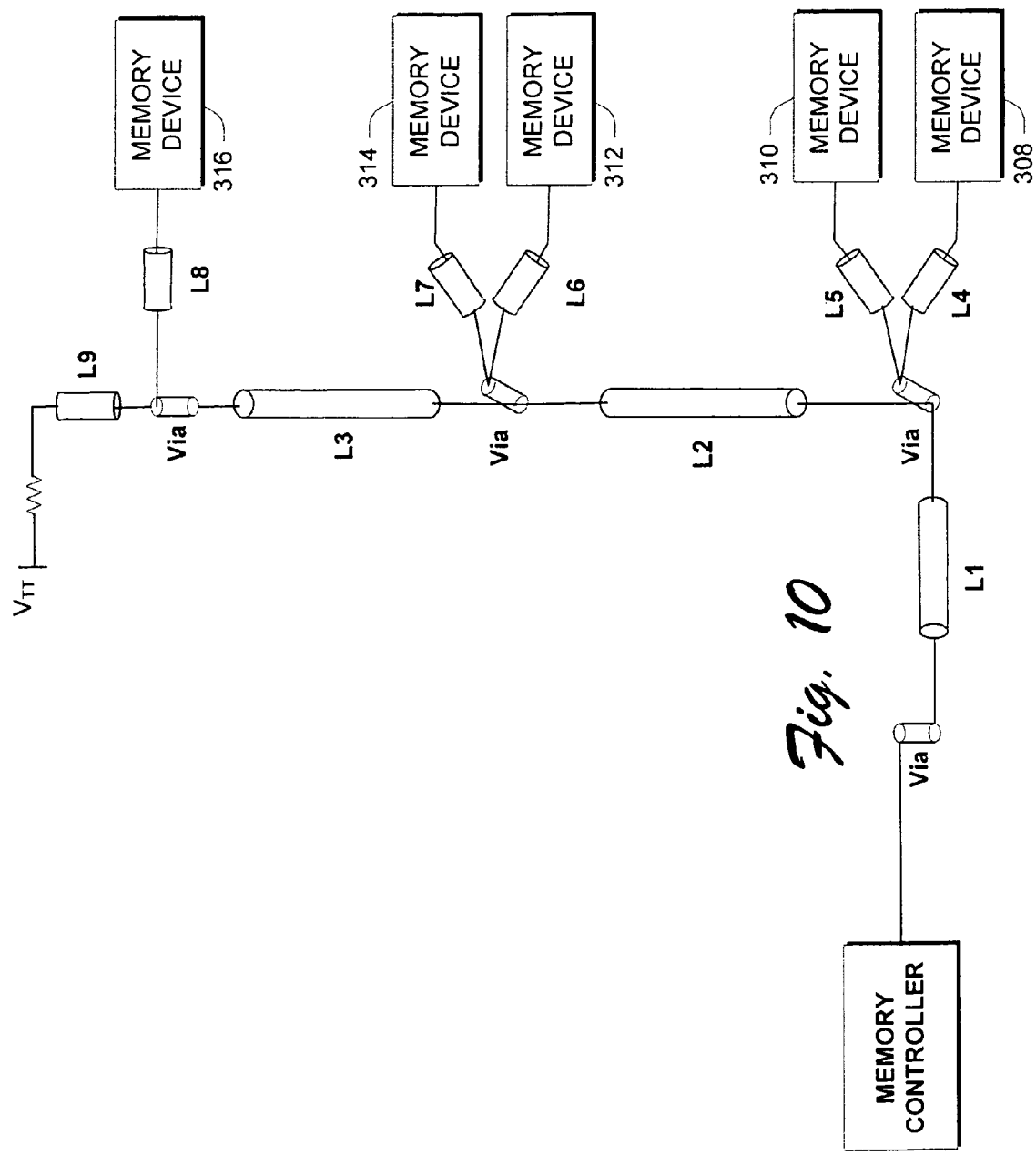
FIG. 10 shows an equivalent electrical loading model for daisy-chained connectivity on the address and control semaphores for the memory system of FIG. 3 in accordance with one embodiment.

In the above-described example, the memory system was configured in a branched-t topology, which is suitable for SDRAMs. Other DRAM standards, such as Double Data Rate (DDR) SDRAMs, can be accommodated by utilizing other topologies. As an example, consider FIG. 10 which illustrates an equivalent electrical loading model for daisy-chained connectivity on the address and control semaphores for a single bank system. In FIG. 10, the output from the memory controller is daisy chained to all of the memory devices. As noted above, this topology is commonly used in connection with DDR memory bus technology, where the memory controller is designed with low impedance output drivers. The resistors connecting to the termination voltage VTT can be located under memory device 308 or 316 (FIG. 5).

Exemplary Dual Bank Embodiment

Figure 11:
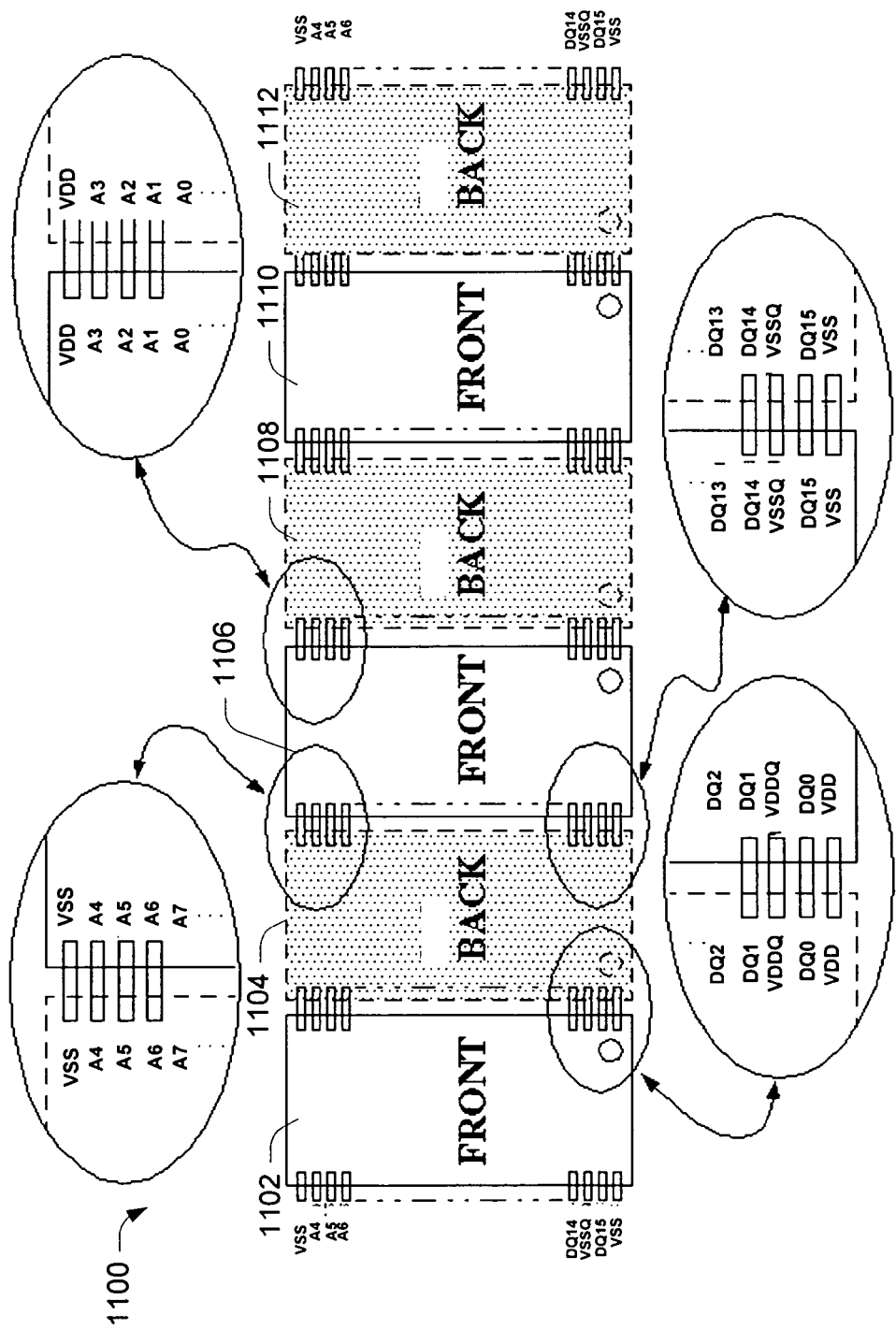
FIG. 11 shows an exemplary memory system that utilizes a staggered memory device configuration in a dual bank DRAM design in accordance with one embodiment.

The concepts discussed above with respect to the staggered mounting of memory devices can be extended to dual bank memory systems as well. As an example, consider FIG. 11 which shows a dual bank memory system generally at 1100 comprising six individual memory devices 1102–1112, with memory devices 1110, 1112 constituting error code checking devices. In this example, all six memory devices are placed in a staggered configuration on the top and bottom side of the circuit board. A branched-t topology can be wired with this layout scheme using two different electrical loading topologies for address and control signals based on the pin assignments on each side of the memory device. The different electrical loading topologies are illustrated respectively in FIGS. 12 and 13.

Figure 12:
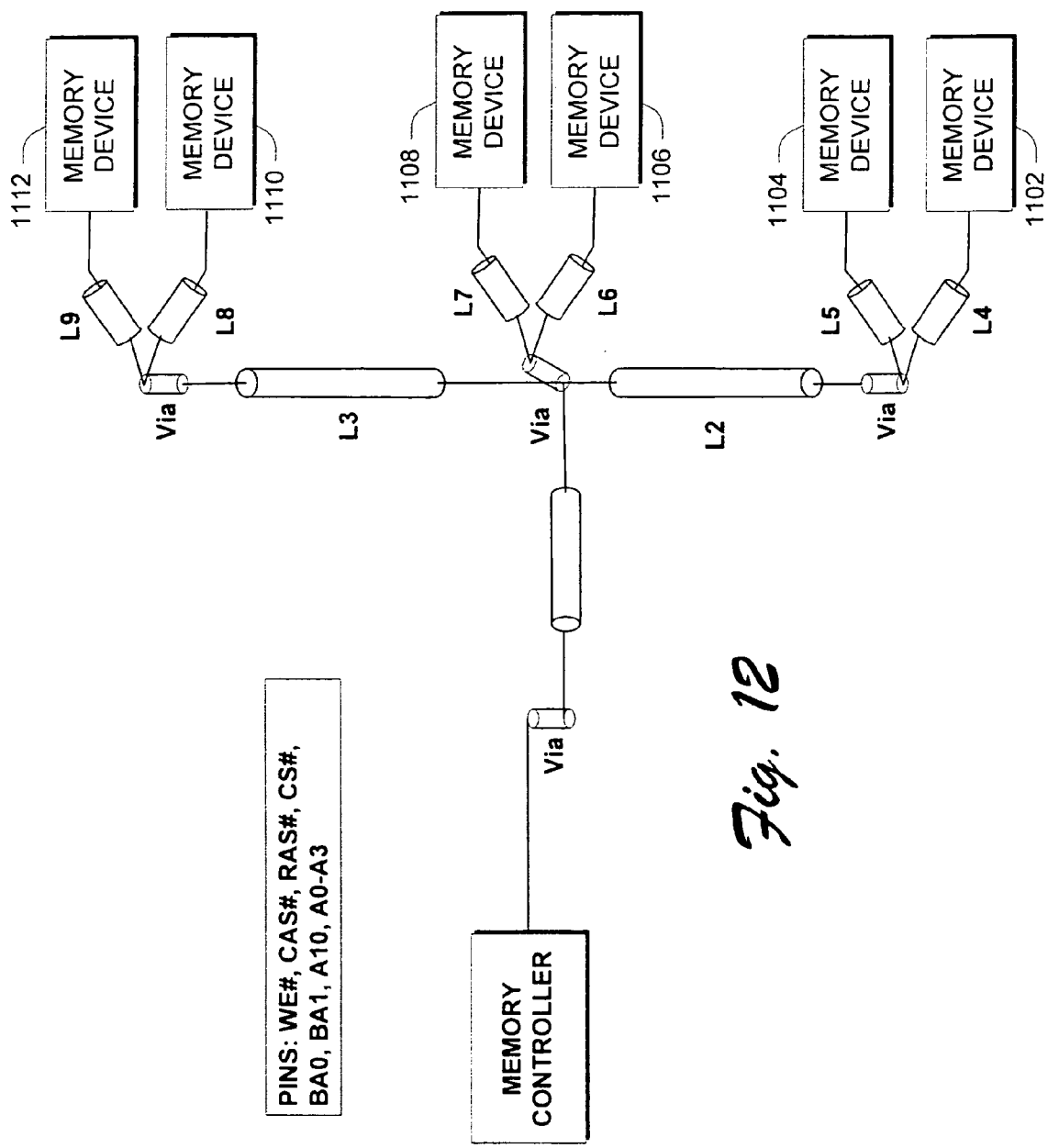
FIG. 12 shows an equivalent electrical loading model on the address and control semaphores for the memory system of FIG. 11.
Figure 13:
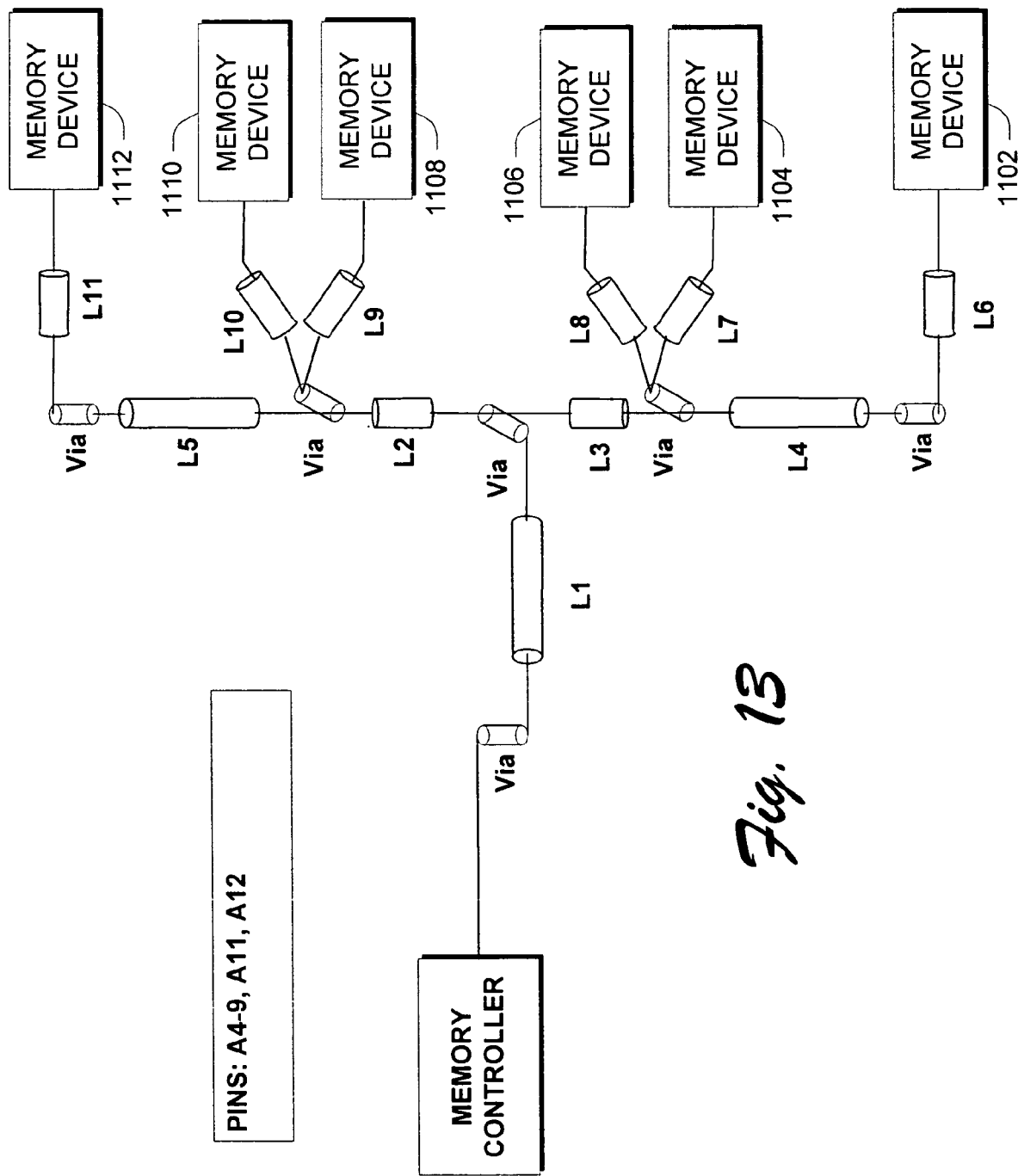
FIG. 13 shows an equivalent electrical loading model on additional address and control semaphores for the memory system of FIG. 11.

With respect to FIGS. 12 and 13, note that the address and control signals from the memory controller wire to all the devices. The connectivity scheme shown in FIG. 12 is applicable for one group of signals, i.e. WE#, CAS#, RAS# and so on. This topology is balanced and utilizes four vias to support the interconnect connectivity from the memory controller to all of the memory devices. Length L1 depends on the location of the memory controller relative to the proposed memory layout stack. Segment L1 can be made very short since all passive components for termination or decoupling are located within the memory layout stack, thus freeing up routing channel area between the memory controller and the memory devices. Routing segments L2 and L3 are two memory device widths long. Segments L4, L5, L6, L7, L8, and L9 are very short top and bottom layer controlled impedance pin escapes where L4<<LVIA.

The connectivity scheme shown in FIG. 13 is applicable for the remaining group of address and, where applicable, control signals indicated in the drawing. This topology is also symmetric from the memory controller and connectivity to all components is accomplished using six vias. Segments L2 and L3 are each one memory device width long. Segments L4 and L5 are two device widths long. Segments L6, L7, L8, L9, L10 and L11 are top or bottom layer controlled impedance pin escapes, again with L6<<LVIA. A comparison of via counts for the dual bank configuration with and without termination resistors is shown in Tables 3 and 4 below.

TABLE 3

Via Count for Unterminated Dual Bank Device

| Signal Type | Back to Back | Staggered |
| --- | --- | --- |
| Address/Control | 7 | 6 |
| Data (LSB) | 4 | 4 |
| Data (MSB) | 4 | 2 |

TABLE 4

Via Count for Terminated Dual Bank Device

| Signal Type | Back to Back | Staggered |
| --- | --- | --- |
| Address/Control | NA | NA |
| Data (LSB) | 5 | 5 |
| Data (MSB) | 5 | 3 |

Figure 14:
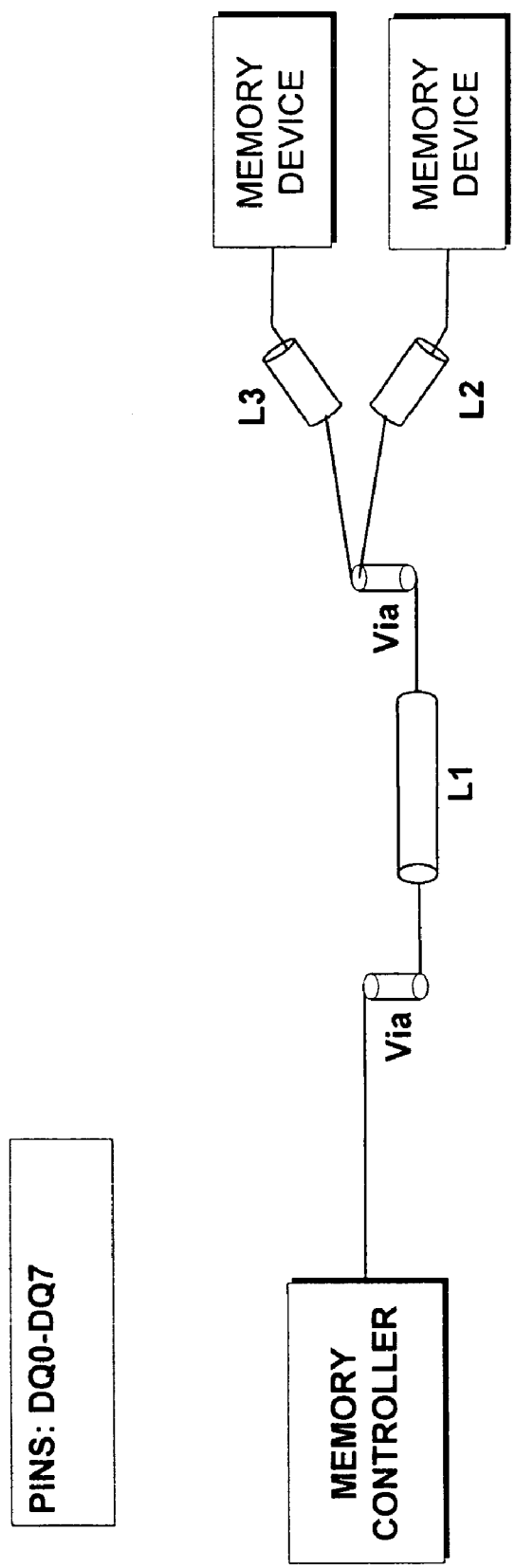
FIG. 14 shows an equivalent electrical loading model on data (LSB) signals for the memory system of FIG. 11.
Figure 15:
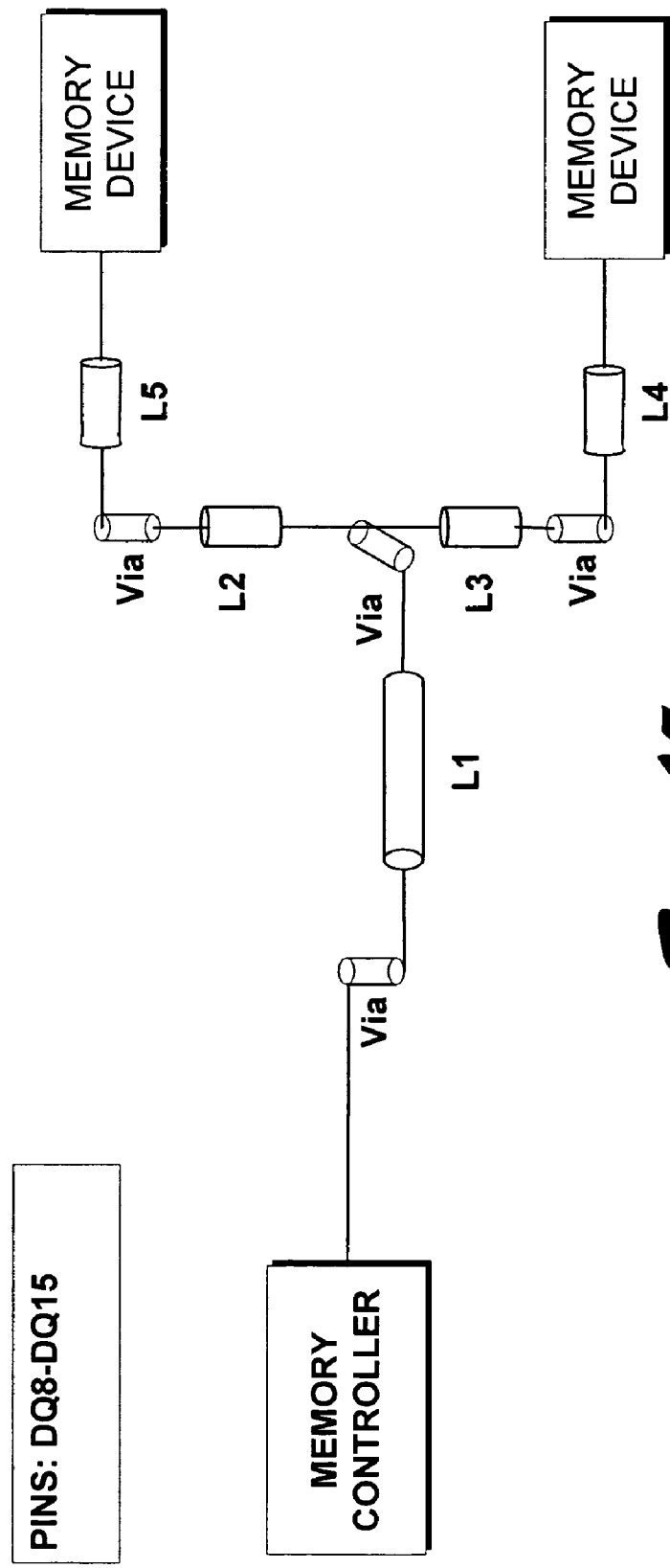
FIG. 15 shows an equivalent electrical loading model on data (MSB) signals for the memory system of FIG. 11.

In the dual memory bank bus interface, each data bit or line from the memory controller connects to two memory devices. The connectivity can be established in layout using the two topologies shown in FIGS. 14 and 15 depending on the data bit pin assignment on the memory device. Segments L2 and L3 in FIG. 14 are top or bottom surface layer controlled impedance pin escapes where L2<<LVIA. Segments L2 and L3 in FIG. 15 are one component device width long. In FIG. 15, segments L4 and L5 are top or bottom surface layer controlled impedance pin escapes where L4<<LVIA. Series termination for all data bits can be accommodated under the image of the memory devices with very short interconnects, in a similar manner to the single bank embodiment discussed above. A dual bank design with back to back mounting of devices (without stagger) would need longer trace segments to connect a pair of data pins to a series termination resistor which is located outside the footprint of the memory devices. This would significantly reduce the effectiveness of the termination, increase routing congestion and limit routing channel area between the memory devices and the memory controller.

In Circuit Testing and Probe Access

The embodiments described above provide vias that are accessible from one side of the circuit board. Thus, there are no special accommodations that need to be made with respect to in-circuit testing and high speed testing. Having vias that are accessible from one side of the circuit board greatly facilitates in circuit testing and probe access, as will be appreciated by the skilled artisan.

Single/Dual Bank Extensions and Limitations

Using x32 memory devices, the concepts discussed above can also be implemented in three memory device and four memory device configurations for single and dual bank applications respectively. For single bank cases, the first and second memory devices serve data bits DQ0–31 and DQ32–63, with the third device providing error code checking. For the dual bank case, the first and second memory devices have their own chip select inputs, each providing 32 bits of data with the third and fourth devices providing error code checking.

Figure 16:
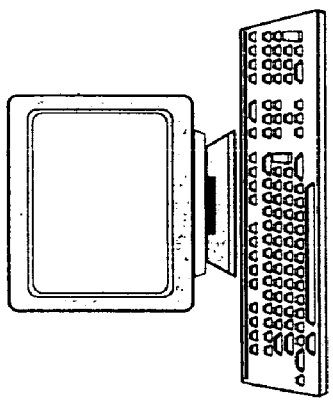
FIG. 16 is a diagram of an exemplary computer system in which various inventive embodiments can be utilized.

FIG. 16 is a diagram of an exemplary computer system in which the various embodiments described above can be employed.

CONCLUSION

The various embodiments described above provide advantages that improve upon memory system design. For example, memory systems that are designed utilizing the concepts described above can have improved power delivery because decoupling capacitors can be placed very close to power and ground pins. Additionally, shorter routing lengths can increase the effectiveness of termination resistor packs that are utilized to terminate data signals. Further, reductions in interconnect loading that are achieved as a result of reducing the number of vias that are utilized improves signal quality and timing. Further, reductions can be achieved in the amount of circuit board real estate that is consumed by the individual memory devices. Additionally, the above-described designs are flexible enough to accommodate various routing topologies, e.g. daisy chain topologies, star topologies, and the like. Additionally, the above-described designs are flexible enough to accommodate different memory device standards, e.g. SDRAMs and DDR SDRAMs.

Although the invention has been described in language specific to structural features and/or methodological steps, it is to be understood that the invention defined in the appended claims is not necessarily limited to the specific features or steps described. Rather, the specific features and steps are disclosed as preferred forms of implementing the claimed invention.

The invention claimed is:

1. An apparatus comprising:
    a circuit board having front and back surfaces;
    at least one memory device having a plurality of pins mounted on the front surface of the circuit board;
    at least one other memory device having a plurality of pins mounted on the back surface of the circuit board;
    said memory devices being mounted on the circuit board such that at least some pins from the one memory device align with at least some pins of the other memory device to provide aligned pin pairs; and
    a via disposed in the circuit board and extending between and connecting individual pins of an aligned pin pair.

2. The apparatus of claim 1 further comprising multiple vias disposed in the circuit board and extending between and connecting individual pins of different aligned pin pairs.

3. The apparatus of claim 2, wherein at least some via-connected pins comprise address pins.

4. The apparatus of claim 2, wherein at least some via-connected pins comprise control pins.

5. The apparatus of claim 2, wherein at least some via-connected pins comprise address pins and other via-connected pins comprise control pins.

6. The apparatus of claim 1, wherein said via-connected pins comprise address pins.

7. The apparatus of claim 1, wherein said via-connected pins comprise control pins.

8. The apparatus of claim 1, wherein said memory devices define a footprint on to circuit board, and further comprising one or more termination resistor packs operably coupled with at least one memory device for terminating data signals associated with a memory device, said one or more termination resistor parks being mounted on the circuit board on a surface opposite of the surface on which its associated memory device is mounted, said one or more termination resistor packs being mounted within the footprint of the associated memory device.

9. The apparatus of claim 1, wherein said memory devices define a footprint on the circuit board, and further comprising one or more decoupling capacitors operably coupled with at least one memory device, said one or mare decoupling capacitors being mounted on the circuit board on a surface opposite of the surface on which its associated memory device is mounted, said one or more decoupling capacitors being mounted within the footprint of the associated memory device.

10. A computer system embodying the apparatus of claim 1.

11. An apparatus comprising:
a circuit board having front and back surfaces;
a first plurality of memory devices, each memory device having a plurality of address pins and control pins mounted on the front surface of the circuit board;
a second plurality of memory devices, each memory device having a plurality of address pins and control pins mounted on the back surface of the circuit board;
said memory devices being configured in a dual bank configuration;
said memory devices being mounted on the circuit board such that at least some address and control pins from a front surface mounted memory device share individual respective vias with at least some corresponding address and control pins of a back surface-mounted memory device;
a memory controller mounted on the circuit board and operably connected with the first and second plurality of memory devices;
wherein a first group of address pins are interconnected with the memory controller using a first topology and a second group of address pins are interconnected with the memory controller using a second different topology.

12. The apparatus of claim 11, wherein the memory devices comprise dual row, gull wing-type devices.

13. The apparatus of claim 11, wherein said memory devices define a footprint on the circuit board, and further comprising one or more termination resistor packs operably coupled with at least one memory device for terminating data signals associated with a memory device, said one or more termination resistor packs being mounted on the circuit board on a surface opposite of the surface on which its associated memory device is mounted, said one or more termination resistor packs being mounted within the footprint of the associated memory device.

14. The apparatus of claim 11, wherein said memory devices define a footprint on the circuit board, and further comprising one or more decoupling capacitors operably coupled with at least one memory device, said one or more decoupling capacitors being mounted on the circuit board on a surface opposite of the surface on which its associated memory device is mounted, said one or more decoupling capacitors being mounted within the footprint of the associated memory device.

15. A computer system embodying the apparatus of claim 11.

16. An apparatus comprising:
a circuit board having front and back surfaces;
at least one memory means mounted on the front surface of the circuit board, said memory means comprising address means and control means;
at least one other memory means mounted on the back surface of the circuit board, said other memory means comprising address means and control means;
means extending through the circuit board and operably connecting individual address means and control means from the one memory means with individual address means and control means from the other memory means;
said means extending through the circuit board being shared between individual respective address means and control means.

17. The apparatus of claim 16, wherein said memory means define individual footprints on the circuit board, and further comprising one or more termination means operably coupled with at least one memory means for terminating data signals associated with a memory means, said one or more termination means being mounted on the circuit board on a surface opposite of the surface on which its associated memory means is mounted, said one or more termination means being mounted within the footprint of the associated memory means.

18. The apparatus of claim 16, wherein said memory means define a footprint on the circuit board, and further comprising one or more decoupling means operably coupled with at least one memory means, said one or more decoupling means being mounted on the circuit board on a surface opposite of the surface on which its associated memory means is mounted, said one or more decoupling means being mounted within the footprint of the associated memory means.

19. A method comprising:
providing a circuit board having front and back surfaces;
mounting a first plurality of memory devices on the front surface of the circuit board, each memory device having a plurality of address pins and control pin; and
mounting a second plurality of memory devices on the back surface of the circuit board, each memory device having a plurality of address pins and control pins;
said acts of mounting being sufficient such that at least some address and control pins from a front surface-mounted memory device share individual respective vias wit at least some corresponding address and control pins of a back surface-mounted memory device.

20. The method of claim 19 further comprising mounting a memory controller on the circuit board, the memory controller being operably connected with the first and second plurality of memory devices.

21. The method of claim 19, wherein said acts of mounting comprise mounting memory devices on the circuit board in a single bank configuration.

22. The method of claim 19, wherein said acts of mounting comprise mounting memory devices on the circuit board in a dual bank configuration.

23. The method of claim 19, wherein the memory devices comprise dual row, gull wing-type devices.

24. The method of claim 19, wherein said acts of mounting comprise mounting memory devices on the circuit board in an interconnected branched-t topology.

25. The method of claim 19, wherein said acts of mounting comprise mounting memory devices on the circuit board in a daisy-chained topology.

26. The method of claim 19, wherein said acts of mounting comprise mounting SDRAM devices on the circuit board.

27. The method of claim 19, wherein said acts of mounting comprise mounting DDR SDRAM devices on the circuit board.

28. The method of claim 19, wherein said memory devices define a footprint on the circuit board, and further comprising mounting one or more termination resistor packs on the circuit board and operably coupled with at least one memory device for terminating data signals associated with a memory device, said one or more termination resistor packs being mounted on the circuit board on a surface opposite of the surface on which its associated memory device is mounted, said one or more termination resistor packs being mounted within the footprint of the associated memory device.

29. The method of claim 19, wherein said memory devices define a footprint on the circuit board, and further comprising mounting one or more decoupling capacitors on the circuit board and operably coupled with at least one memory device, said one or more decoupling capacitors being mounted on the circuit board on a surface opposite of the surface on which its associated memory device is mounted, said one or more decoupling capacitors being mounted within the footprint of the associated memory device.

* * * * *

UNITED STATES PATENT AND TRADEMARK OFFICE
CERTIFICATE OF CORRECTION

PATENT NO. : 7,113,418 B2  
APPLICATION NO. : 10/700389  
DATED : September 26, 2006  
INVENTOR(S) : William L. Oberlin et al.

Page 1 of 1

It is certified that error appears in the above-identified patent and that said Letters Patent is hereby corrected as shown below:

In column 3, line 2, delete "10a" and insert -- 110a --, therefor.

In column 9, line 6, in Claim 8, delete "to" and insert -- the --, therefor.

In column 9, line 10, in Claim 8, delete "parks" and insert -- packs --, therefor.

In column 9, line 18, in Claim 9, delete "mare" and insert -- more --, therefor.

In column 10, line 53, in Claim 19, delete "wit" and insert -- with --, therefor.

Signed and Sealed this

Thirtieth Day of June, 2009

JOHN DOLL  
*Acting Director of the United States Patent and Trademark Office*